(12) United States Patent
Lee et al.

(10) Patent No.: US 10,714,668 B2
(45) Date of Patent: Jul. 14, 2020

(54) LIGHT-EMITTING DEVICE AND MANUFACTURING METHOD THEREOF

(71) Applicant: Au Optronics Corporation, Hsinchu (TW)

(72) Inventors: Ming-Hsien Lee, Hsinchu (TW); Yi-Cheng Lin, New Taipei (TW); Chuang-Cheng Yang, Changhua County (TW); Kai-Wei Hong, Hsinchu (TW); Chun-Feng Lin, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/278,731

(22) Filed: Feb. 19, 2019

(65) Prior Publication Data

US 2020/0028044 A1    Jan. 23, 2020

(30) Foreign Application Priority Data

Jul. 18, 2018 (TW) .............................. 107124810 A

(51) Int. Cl.
- *H01L 25/075* (2006.01)
- *H01L 33/62* (2010.01)
- *H01L 27/12* (2006.01)

(52) U.S. Cl.
CPC .......... *H01L 33/62* (2013.01); *H01L 25/0753* (2013.01); *H01L 27/124* (2013.01); *H01L 27/1259* (2013.01); *H01L 2933/0066* (2013.01)

(58) Field of Classification Search
CPC ... H01L 33/62; H01L 27/1259; H01L 27/124; H01L 25/0753; H01L 2933/0066; H01L 25/167; H01L 27/156; H01L 27/3276; H01L 27/3244; G09G 3/32

See application file for complete search history.

(56) References Cited

U.S. PATENT DOCUMENTS

| | | | |
|---|---|---|---|
| 7,208,760 B2 | 4/2007 | Hector et al. | |
| 9,703,057 B2 | 7/2017 | Tsujita et al. | |
| 2005/0146279 A1 | 7/2005 | Hector et al. | |
| 2012/0074423 A1 | 3/2012 | Kanegae | |
| 2016/0216464 A1 | 7/2016 | Tsujita et al. | |
| 2017/0154943 A1* | 6/2017 | Yang | G09G 3/3208 |

FOREIGN PATENT DOCUMENTS

| | | |
|---|---|---|
| CN | 1643687 | 7/2005 |
| CN | 101764148 | 6/2010 |
| CN | 103490012 | 1/2014 |
| TW | 201516500 | 5/2015 |
| TW | M520726 | 4/2016 |

* cited by examiner

*Primary Examiner* — Kyoung Lee
(74) *Attorney, Agent, or Firm* — JCIPRNET

(57) ABSTRACT

A light-emitting device includes a substrate, a circuit array including a plurality of circuit units disposed on the substrate, a first conductive pattern, a second conductive pattern, a first wire pattern, and a second wire pattern disposed on the circuit array, and a light-emitting element disposed on one of the circuit units. The light-emitting element includes a first electrode and a second electrode respectively electrically connected to the first conductive pattern and the second conductive pattern. The second electrode is not overlapped with the first wire pattern and the second wire pattern. A manufacturing method of the light-emitting device is also provided.

12 Claims, 4 Drawing Sheets

LIGHT-EMITTING DEVICE AND MANUFACTURING METHOD THEREOF

CROSS REFERENCE TO RELATED APPLICATION

This application claims the priority benefit of Taiwan application serial no. 107124810, filed on Jul. 18, 2018. The entirety of the above-mentioned patent application is hereby incorporated by reference herein and made a part of specification.

BACKGROUND OF THE INVENTION

Field of the Invention

The invention relates to a light-emitting device and a manufacturing method thereof, and more particularly, to a light-emitting device improving IR drop and a manufacturing method thereof.

Description of Related Art

A light-emitting diode (LED) has many advantages such as power saving, long service life, quick start, and small size, and therefore has been extensively applied in flat panel displays in recent years. In particular, a common light-emitting diode includes an organic light-emitting diode (OLED), a micro LED, a mini LED, and a quantum dot.

Currently, in a light-emitting device including an LED, a signal line or a power line is generally provided to connect a circuit unit and an LED, but in the case of a fine line, the signal line or power line has high resistance. When the signal line or power line transfers a drive current to each LED, issues such as current crowding or IR drop occur. Moreover, the IR drop is further proportional to the total number of the LED, such that the emission luminance of each LED is reduced as the total number of the LED is increased, and therefore display quality of the light-emitting device is reduced.

SUMMARY OF THE INVENTION

The manufacturing method of the light-emitting device of an embodiment of the invention includes the following steps. A circuit array is formed on a substrate, wherein the circuit array includes a plurality of circuit units. A first conductive pattern, a second conductive pattern, a first wire pattern, and a second wire pattern are formed on the circuit array at the same time. A light-emitting element is disposed on one of the circuit units, wherein the light-emitting element includes a first electrode and a second electrode respectively electrically connected to the first conductive pattern and the second conductive pattern.

In an embodiment of the invention, before the step of disposing the light-emitting elements, further includes the following. A first seed pattern and a second seed pattern are formed and respectively located on the first conductive pattern and the second conductive pattern. The method of forming the first seed pattern and the second seed pattern comprises a sputtering method, thermal evaporation method, electron gun (E-Gun) vacuum evaporation method, or atomic layer chemical vapor deposition method. The materials of the first conductive pattern and the second conductive pattern include indium tin oxide, molybdenum, aluminum, titanium, titanium oxide, copper or a copper alloy, or silver or a silver alloy. Moreover, voltage is applied to the first conductive pattern and the second conductive pattern and the first pad and the second pad are formed by an electroplating method and respectively located on the first seed pattern and the second seed pattern. After the step of disposing the light-emitting elements, the first pad and the second pad are respectively electrically connected to the first electrode and the second electrode.

In an embodiment of the invention, the manufacturing method of the light-emitting device further includes the following. A third seed pattern and a fourth seed pattern are formed and respectively located on the first wire pattern and the second wire pattern. A first power line and a second power line are formed and respectively located on the third seed pattern and the fourth seed pattern. The first power line, the second power line, the first pad, and the second pad are formed at the same time.

The light-emitting device of an embodiment of the invention includes a substrate and a circuit array disposed on the substrate, and the circuit array includes a plurality of circuit units; a first conductive pattern, a second conductive pattern, a first wire pattern, and a second wire pattern disposed on the circuit array, and a light-emitting element disposed on one of the circuit units. The light-emitting element includes a first electrode and a second electrode respectively electrically connected to the first conductive pattern and the second conductive pattern, and the second electrode is not overlapped with the first wire pattern and the second wire pattern.

In an embodiment of the invention, the light-emitting device further includes a first seed pattern and a second seed pattern respectively located on the first conductive pattern and the second conductive pattern, and the materials of the first conductive pattern and the second conductive pattern include indium tin oxide, molybdenum, aluminum, titanium, titanium oxide, copper or a copper alloy, silver or a silver alloy. The first pad and the second pad are respectively located on the first seed pattern and the second seed pattern, and the first pad and the second pad are respectively electrically connected to the first electrode and the second electrode. The third seed pattern and the fourth seed pattern are respectively located on the first wire pattern and the second wire pattern. The first power line and the second power line are respectively located on the third seed pattern and the fourth seed pattern, and the first power line, the second power line, the first pad, and the second pad are located on the same patterned film layer, and the materials of the first power line, the second power line, the first pad, and the second pad include copper, silver, gold, aluminum, tin, or nickel.

In the light-emitting device and the manufacturing method thereof of an embodiment of the invention, since the first pad, the second pad, the first power line, and the second power line can be formed at the same time by a material having low resistance, the process can be simplified, and the resistance of the first power line and the second power line can be lowered to reduce current crowding and reduce IR drop. As a result, in comparison to the power line design of the known light-emitting device, the light-emitting device of an embodiment of the invention can reduce energy consumption and reduce voltage drop to increase the brightness, uniformity, and light-emitting quality of the light-emitting elements. Moreover, since the power voltage supplied to the light-emitting elements and the most suitable operating voltage of the light-emitting elements are substantially the same, the service life of the light-emitting elements can be increased. Accordingly, the overall brightness of the light-emitting device can be increased, and the quality of the light-emitting device can be further increased.

One of the objects of the invention is to lower the resistance of the power line.

One of the objects of the invention is to reduce current crowding.

One of the objects of the invention is to reduce the IR drop.

One of the objects of the invention is to increase the light-emitting quality of the light-emitting elements.

One of the objects of the invention is to increase the service life of the light-emitting elements.

One of the objects of the invention is to simplify the manufacturing process of the light-emitting device.

One of the objects of the invention is to increase the brightness of the light-emitting device.

One of the objects of the invention is to reduce the energy consumption of the light-emitting device.

One of the objects of the invention is to increase the quality of the light-emitting device.

One of the objects of the invention is to increase the brightness uniformity of the light-emitting device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
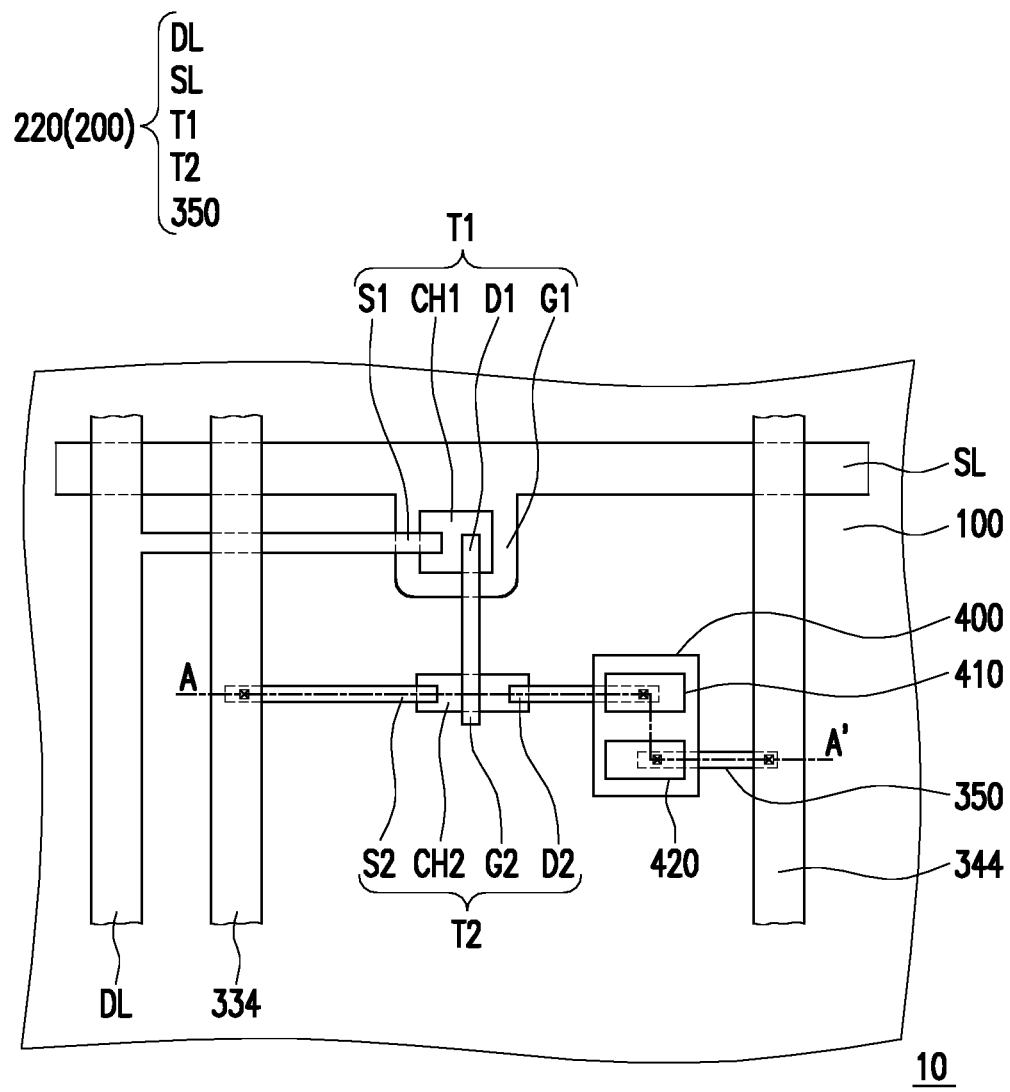
FIG. 1 is a partially-enlarged top view of a light-emitting device of an embodiment of the invention.
Figure 2:
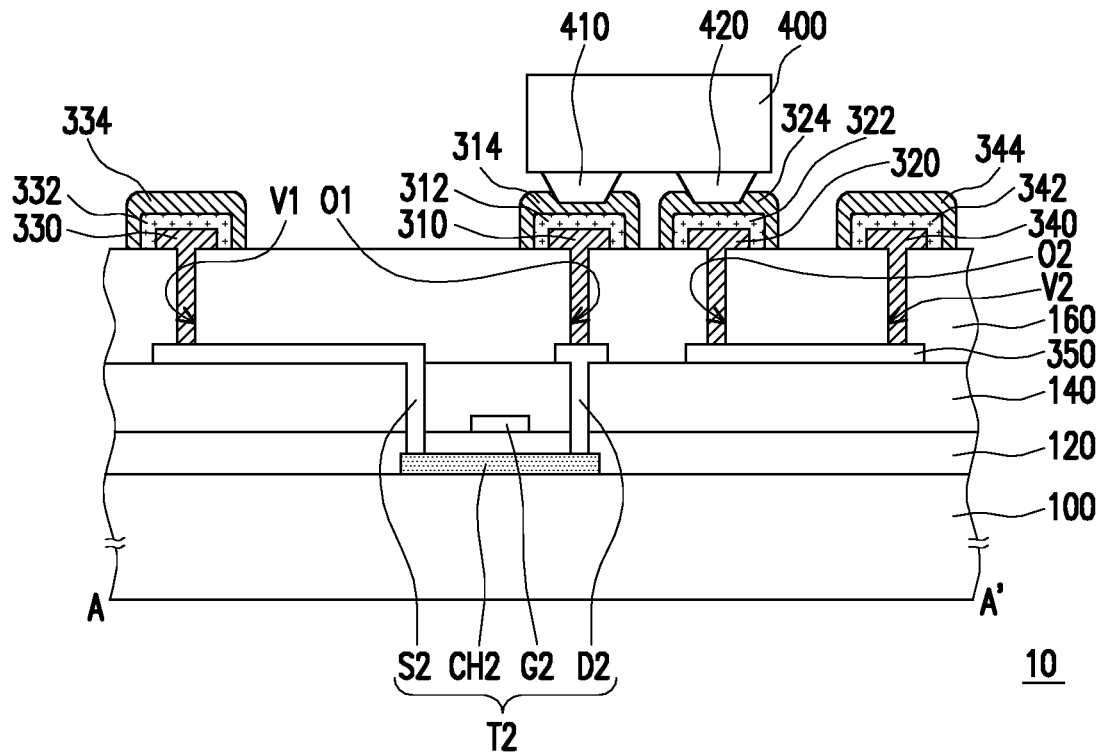
FIG. 2 is a cross section along section line A-A' of the light-emitting device of FIG. 1.
Figure 3:
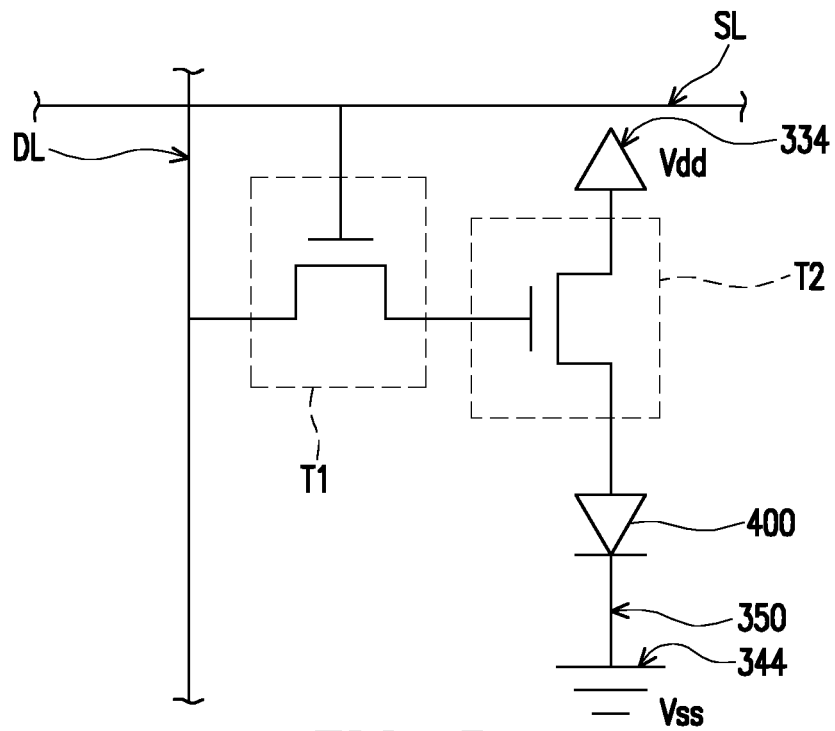
FIG. 3 is an equivalent circuit diagram of the light-emitting device of FIG. 1.

FIG. 1 is a partially-enlarged top view of a light-emitting device of an embodiment of the invention. For convenience and observation, FIG. 1 omits a portion of the members. FIG. 2 is a cross section along section line A-A' of the light-emitting device of FIG. 1. FIG. 3 is an equivalent circuit diagram of the light-emitting device of FIG. 1. Referring first to FIG. 1 and FIG. 2, in the present embodiment, a light-emitting device 10 includes a substrate 100; a circuit array 200 is disposed on the substrate 100, wherein the circuit array 200 includes a plurality of circuit units 220; a first conductive pattern 310, a second conductive pattern 320, a first wire pattern 330, and a second wire pattern 340 are disposed on the circuit array 200; and a plurality of light-emitting elements 400 are respectively disposed on the circuit units 220. Each of the light-emitting elements 400 includes a first electrode 410 and a second electrode 420 respectively electrically connected to the first conductive pattern 330 and the second conductive pattern 340. The second electrode 420 is not overlapped with the first wire pattern 330 and the second wire pattern 340. It should be mentioned that, FIG. 1 is a partially-enlarged view of the light-emitting device 10 and only schematically shows one circuit unit 200, and one of the light-emitting elements 400 is disposed on one of the circuit units 220, but the invention is not limited thereto.

In the present embodiment, the first seed pattern 312 and the second seed pattern 322 are respectively located on the first conductive pattern 310 and the second conductive pattern 320. The materials of the first conductive pattern 310 and the second conductive pattern 320 include indium tin oxide, molybdenum, aluminum, titanium, titanium oxide, copper or a copper alloy, silver or a silver alloy, or other suitable materials, but the invention is not limited thereto.

In the present embodiment, the first pad 314 and the second pad 324 are respectively located on the first seed pattern 312 and the second seed pattern 322. The first pad 314 and the second pad 324 are respectively electrically connected to the first electrode 410 and the second electrode 420.

In the present embodiment, the third seed pattern 332 and the fourth seed pattern 342 are respectively located on the first wire pattern 330 and the second wire pattern 340. The first power line 334 and the second power line 344 are respectively located on the third seed pattern 332 and the fourth seed pattern 342.

It should be mentioned that, the first seed pattern 312 and the second seed pattern 322 are respectively located on the first conductive pattern 310 and the second conductive pattern 320, and the third seed pattern 332 and the fourth seed pattern 342 are respectively located on the first wire pattern 330 and the second wire pattern 340. Therefore, the first pad 314 and the second pad 324 can be respectively disposed on the first seed pattern 312 and the second seed pattern 332 in the same process step, and the first power line 334 and the second power line 344 are respectively disposed on the third seed pattern 332 and the fourth seed pattern 342. As a result, the first power line 334, the second power line 344, the first pad 314, and the second pad 324 are of the same patterned film layer and can be made by the same material to simplify the process. In the present embodiment, the materials of the first power line 334, the second power line 344, the first pad 314, and the second pad 324 include copper, silver, gold, aluminum, tin, nickel, or other materials having low resistance, but the invention is not limited thereto.

In the following, copper is used as the material for the first power line 334, the second power line 344, the first pad 314, and the second pad 324 as an example, but the invention is not limited thereto. Referring to FIG. 2, since the first pad 314, the second pad 324, the first power line 334, and the second power line 344 formed by copper having low resistance are respectively disposed on the first conductive pattern 310, the second conductive pattern 320, the first wire pattern 330, and the second wire pattern 340, in comparison to a known structure, a power supply line having lower resistance is used in the present embodiment. Moreover, since the power lines 334 and 344 cover the seed patterns 332 and 342 and the wire patterns 330 and 340, the power lines 334 and 344 have a greater cross-sectional area in comparison to the wire patterns 330 and 340. In comparison to directly using the wire patterns 330 and 340 as wires supplying power, in the present embodiment, a power supply line having lower resistance is used, and current crowding can be further reduced, and IR drop can be reduced.

Referring to FIG. 1 and FIG. 2, in the present embodiment, each of the circuit units 220 includes a scan line SL and a data line DL, a first thin-film transistor T1, a second thin-film transistor T2, and a connecting pattern 350. In the present embodiment, the scan line SL and the data line DL are disposed on the substrate 100. The scan line SL and the data line DL may be of different film layers and are interlaced with each other, but the invention is not limited thereto.

Referring to FIG. 1, FIG. 2, and FIG. 3, in the present embodiment, the first thin-film transistor T1 and the second thin-film transistor T2 are located on the substrate 100. The first thin-film transistor T1 is electrically connected to the scan line SL and the data line DL and includes a first gate G1, a first channel layer CH1, a first source S1, and a first drain D1. The first source S1 and the first drain D1 are respectively electrically connected to the first channel layer CH1. In the present embodiment, the first gate G1 is electrically connected to the scan line SL and the two may be of the same film layer. Similarly, the first source S1 and the data line DL may be of the same film layer, but the invention is not limited thereto. In the present embodiment, the first source S1 is electrically connected to the data line DL. The first thin-film transistor T1 is exemplified by a bottom-gate thin-film transistor, but the invention is not limited thereto. According to other embodiments, the first thin-film transistor T1 can also be a top-gate thin-film transistor or other suitable forms of thin-film transistors.

In the present embodiment, the second thin-film transistor T2 is electrically connected to the first thin-film transistor T1, the first power line 334, and the first conductive pattern 310. For instance, the second thin-film transistor T1 includes a second gate G2, a second channel layer CH2, a second source S2, and a second drain D2. The second source S2 and the second drain D2 are respectively electrically connected to the second channel layer CH2. The first drain D1 of the first thin-film transistor T1 is electrically connected to the second gate G2 of the second thin-film transistor T2. For instance, the first drain D1 and the second gate G2 are of the same film layer and can be formed at the same time, but the invention is not limited thereto. The second source S2 is electrically connected to the first power line 334, and the second drain D2 is electrically connected to the first conductive pattern 310. The second thin-film transistor T2 is exemplified by a top-gate thin-film transistor, but the invention is not limited thereto. According to other embodiments, the second thin-film transistor T2 can also be a bottom-gate thin-film transistor or other suitable forms of thin-film transistors.

As shown in FIG. 2 and FIG. 3, in the present embodiment, through the first wire pattern 310 and the first pad 314, the light-emitting elements 400 are electrically connected to the first power line 334 to receive a power voltage Vdd (shown in FIG. 3). In the present embodiment, the first electrode 410 of the light-emitting element 400 is overlapped with the first conductive pattern 310 and the first pad 314, and the second electrode 420 is overlapped with the second conductive pattern 320 and the second pad 324. The second electrode 420 is not overlapped with the first wire pattern 330 and the second wire pattern 340, but the invention is not limited thereto.

In the present embodiment, the connecting pattern 350 is electrically connected between the second conductive pattern 320 and the second wire pattern 340. Accordingly, the light-emitting elements 400 are electrically connected to a reference voltage Vss (shown in FIG. 3) of the second power line 344. In the present embodiment, the connecting pattern 350, the second source S2, and the second drain D2 are of the same film layer and be formed at the same time, but the invention is not limited thereto.

In short, in the light-emitting device 10 of an embodiment of the invention, since the pads 314 and 324 and the power lines 334 and 344 can be formed at the same time using a material having low resistance, the process can be simplified. Moreover, the cross-sectional area of the power lines 334 and 344 can be increased, and therefore the resistance of the power lines 334 and 344 can be lowered to reduce current crowding and reduce IR drop. As a result, in comparison to the power line design of a known light-emitting device, the light-emitting device 10 of an embodiment of the invention can reduce energy consumption and reduce voltage drop to increase the brightness, brightness uniformity, and light-emitting quality of the light-emitting elements 400. Moreover, since the power voltage supplied to the light-emitting elements 400 and the most suitable operating voltage of the light-emitting elements 400 are substantially the same, the service life of the light-emitting elements 400 can be increased. Accordingly, the overall brightness of the light-emitting device 10 can be increased, and the quality of the light-emitting device 10 can be further increased.

In the following, the above embodiments are exemplified, and the manufacturing method of the light-emitting device 10 of an embodiment of the invention is simply described. For instance, as shown in FIG. 1 and FIG. 2, a circuit array 200 is formed on the substrate 100, wherein the circuit array 200 includes a plurality of circuit units 220. In the present embodiment, the material of the substrate 100 is, for instance, glass, quartz, organic polymer, or other suitable materials, but the invention is not limited thereto. In other embodiments, the material of the substrate 100 can also be a conductive material, a wafer, a ceramic, or other suitable materials, but the invention is not limited thereto.

As shown in FIG. 1, each of the circuit units 220 includes a scan line SL and a data line DL, a first thin-film transistor T1, a second thin-film transistor T2, and a connecting pattern 350. Based on conductivity considerations, a metal material is generally used for the scan line SL, the data line DL, and the connecting pattern 350, but the invention is not limited thereto, and based on other embodiments, other conductive materials can also be used for the scan line SL, the data line DL, and the connecting pattern 350, such as an alloy, nitride of a metal material, oxide of a metal material, oxynitride of a metal material, or stacked layers of a metal material and other conductive materials.

In the present embodiment, the first thin-film transistor T1 and the second thin-film transistor T2 are formed on the substrate 100 and are electrically connected to each other. For instance, the first thin-film transistor T1 includes a first gate G1, a first channel layer CH1, a first source S1, and a first drain D1. The first source S1 and the first drain D1 are respectively electrically connected to the first channel layer CH1. The second thin-film transistor T2 includes a second gate G2, a second channel layer CH2, a second source S2, and a second drain D2. The second source S2 and the second drain D2 are respectively electrically connected to the second channel layer CH2. The first drain D1 is electrically connected to the second gate G2. In the present embodiment, the materials of the first channel layer CH1 and the second channel layer CH2 can be the same, but the invention is not limited thereto. For instance, the materials of the first channel layer CH1 and the second channel layer CH2 include an inorganic semiconductor material or an organic semiconductor material, and the inorganic semiconductor material can be one of amorphous silicon (a-Si), indium gallium zinc oxide (IGZO), or polycrystalline silicon, but the invention is not limited thereto.

In the present embodiment, the light-emitting device 10 further includes a gate-insulating layer 120. The gate-insulating layer 120 is formed on the substrate 100 and covers the second channel layer CH2, and is disposed between the second channel layer CH2 and the second gate G2. Next, an interlayer insulating layer 140 is formed on the gate-insulating layer 120 to cover the second gate G2. A second source S2, a second drain D2, and a connecting pattern 350 are formed on the interlayer insulating layer 140. Next, a passivation layer 160 is formed on the interlayer insulating layer 140 to cover the second source S2, the second drain D2, and the connecting pattern 350. In the present embodiment, the materials of the gate-insulating layer 120, the interlayer insulating layer 140, and the passivation layer 160 can be an inorganic material, an organic material, or a combination thereof. The inorganic material is, for instance, silicon oxide, silicon nitride, silicon oxynitride, or stacked layers of at least two materials above, but the invention is not limited thereto.

Next, the first conductive pattern 310, the second conductive pattern 320, the first wire pattern 330, and the second wire pattern 340 are formed at the same time on the circuit array 200. Specifically, the first conductive pattern 310, the second conductive pattern 320, the first wire pattern 330, and the second wire pattern 340 are disposed on the passivation layer 160, and the first wire pattern 330 is electrically connected to the second source S2 through a contact hole V1 of the passivation layer 160, the first conductive pattern 310 is electrically connected to the second drain D2 through a contact hole O1 of the passivation layer 160, and the second conductive pattern 320 and the second wire pattern 340 are respectively electrically connected to the connecting pattern 350 through contact holes O2 and V2 of the passivation layer 160. In the present embodiment, the materials of the first conductive pattern 310 and the second conductive pattern 320 include indium tin oxide, molybdenum, aluminum, titanium, titanium oxide, copper or a copper alloy, or silver or a silver alloy. The materials of the first wire pattern 330 and the second wire pattern 340 can be the same as the materials of the first conductive pattern 310 and the second conductive pattern 320, but the invention is not limited thereto.

Next, before the step of disposing the light-emitting elements 400, the first seed pattern 312 and the second seed pattern 322 are first formed and respectively located on the first conductive pattern 310 and the second conductive pattern 320. In the present embodiment, the method of forming the first seed pattern 312 and the second seed pattern 322 is a sputtering method, thermal evaporation method, electron gun vacuum evaporation method, atomic layer chemical vapor deposition method, or other suitable methods, but the invention is not limited thereto. The materials of the first seed pattern 312 and the second seed pattern 322 can include copper, silver, gold, aluminum, tin, nickel, or other suitable materials, but the invention is not limited thereto.

Moreover, the third seed pattern 332 and the fourth seed pattern 342 can be formed and respectively located on the first wire pattern 330 and the second wire pattern 340. In the present embodiment, the method of forming the third seed pattern 332 and the fourth seed pattern 342 is a sputtering method, thermal evaporation method, electron gun vacuum evaporation method, atomic layer chemical vapor deposition method, or other suitable methods, but the invention is not limited thereto. The materials of the third seed pattern 332 and the fourth seed pattern 342 can include copper, silver, gold, aluminum, tin, nickel, or other suitable materials, but the invention is not limited thereto. In the present embodiment, the seed patterns 312, 322, 332, and 342 can be formed at the same time or sequentially, but the invention is not limited thereto.

Next, voltage is applied to the first conductive pattern 310 and the second conductive pattern 320, and the first pad 314 and the second pad 324 are formed by an electroplating method and respectively located on the first seed pattern 312 and the second seed pattern 322. Similarly, voltage is applied to the first wire pattern 330 and the second wire pattern 340, and the first power line 334 and the second power line 344 are formed by an electroplating method and respectively located on the third seed pattern 332 and the fourth seed pattern 342. In the present embodiment, the first power line 334, the second power line 344, the first pad 314, and the second pad 324 are formed at the same time. As a result, the power lines 334 and 344 and the pads 314 and 324 can be formed at the same time by the same electroplating process to simplify the process.

In the above embodiments, the power lines 334 and 344 and the pads 314 and 324 are formed by an electroplating method, but the invention is not limited thereto. In other embodiments, the power lines 334 and 344 and the pads 314 and 324 can also be formed at the same time by other methods. In the following, description is provided with one embodiment.

In the present embodiment, after the first seed pattern 312, the second seed pattern 322, the third seed pattern 332, and the fourth seed pattern 342 are formed, the substrate 100 is immersed in a chemical plating solution (not shown). In the case of electroless copper plating, the chemical plating solution includes, for instance, copper sulfate and formaldehyde, wherein formaldehyde is used as a reducing agent reducing divalent copper ion to metal copper, but the invention is not limited thereto. As a result, the first pad 314 and the second pad 324 can be formed by an electroless plating method and are respectively located on the first seed pattern 312 and the second seed pattern 322. Similarly, the first power line 334 and the second power line 344 are formed by an electroless plating method and respectively located on the third seed pattern 332 and the fourth seed pattern 342. As a result, the power lines 334 and 344 and the pads 314 and 324 can be formed at the same time by the same electroless plating process to simplify the process.

In the present embodiment, the first pad 314 is grown on the first seed pattern 312, and in actuality the first pad 314 and the first seed pattern 312 may be regarded as one single unit. Similarly, the second pad 324 and the second seed pattern 322 may be regarded as one single unit, the first power line 334 and the third seed pattern 332 may be regarded as one single unit, and the second power line 344 and the fourth seed pattern 342 may be regarded as one single unit. Accordingly, the cross-sectional area of the power supply line formed by the first power line 334 and the third seed pattern 332 and another power supply line formed by the second power line 344 and the fourth seed pattern 342 can be increased, and therefore the resistance of the power supply lines can be lowered. Moreover, the materials of the first power line 334, the second power line 344, the first pad 314, and the second pad 324 include copper, silver, gold, aluminum, tin, nickel, or other materials having low resistance, but the invention is not limited thereto. Under the configuration above, the power lines 334 and 344 can be formed by a material having low resistance, and in the present embodiment, power lines having lower resistance are used. Moreover, in the present embodiment, power supply lines having lower resistance are used, and therefore current crowding can be reduced and IR drop can be reduced.

Lastly, referring to FIG. 1 and FIG. 2, a light-emitting element 400 is disposed on one of the circuit units 220. In the present embodiment, the light-emitting element 400 includes a first electrode 410 and a second electrode 420 respectively electrically connected to the first conductive pattern 310 and the second conductive pattern 320. For instance, after the step of disposing the light-emitting element 400, the first pad 314 and the second pad 324 are respectively electrically connected to the first electrode 410 and the second electrode 420. The second electrode 420 is not overlapped with the first wire pattern 310 and the second wire pattern 320. In the present embodiment, the method of disposing a plurality of light-emitting elements 400 respectively on the plurality of circuit units 220 includes, for instance, transferring the plurality of light-emitting elements 400 from a carrier onto the substrate 100 and respectively electrically connecting the plurality of light-emitting elements 400 to the plurality of circuit units 220, but the invention is not limited thereto.

In short, in the light-emitting device 10 of an embodiment of the invention, since the pads 314 and 324 and the power lines 334 and 344 can be formed at the same time by a material having low resistance, the process can be simplified. Moreover, the power lines 334 and 344 can be formed by a material having low resistance, and therefore power lines having lower resistance are obtained to reduce current crowding and reduce IR drop. Moreover, the first power line 334 and the third seed pattern 332 may be regarded as one single unit to form a power supply line, and the second power line 344 and the fourth seed pattern 342 may be regarded as one single unit to form a power supply line, and therefore the cross-sectional area of at least one of the power supply lines can be increased to further lower the resistance thereof. As a result, in comparison to the power line design of a known light-emitting device, the light-emitting device 10 of an embodiment of the invention can reduce energy consumption and reduce voltage drop to increase the brightness and light-emitting quality of the light-emitting elements 400. Moreover, since the power voltage supplied to the light-emitting elements 400 and the most suitable operating voltage of the light-emitting elements 400 are substantially the same, the service life and brightness uniformity of the light-emitting elements 400 can be increased. Accordingly, the overall brightness of the light-emitting device 10 can be increased, and the quality of the light-emitting device 10 can be further increased.

The following embodiments adopt the reference numerals of the embodiments above and a portion of the contents thereof, wherein the same reference numerals are adopted to represent the same or similar elements. Some of the descriptions of the same technical content omitted are as provided in the embodiments above and are not repeated in the following embodiments.

Figure 4:
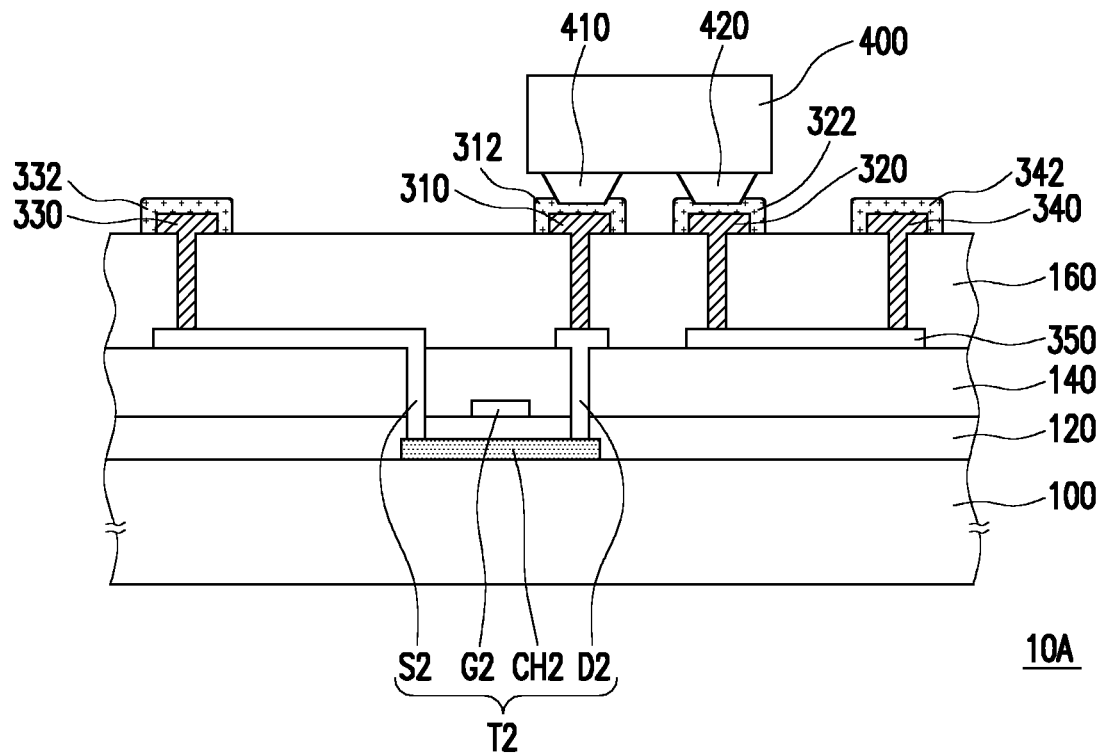
FIG. 4 is a cross section of a light-emitting device of another embodiment of the invention.

FIG. 4 is a cross section of a light-emitting device of another embodiment of the invention. Referring to FIG. 2 and FIG. 4, a light-emitting device 10A of the present embodiment is similar to the light-emitting device 10 of FIG. 2, and the main difference is that the first electrode 410 is directly electrically connected to the first seed pattern 312 and the second electrode 420 is directly electrically connected to the second seed pattern 322. The third seed pattern 332 is formed on the first wire pattern 330 and the fourth seed pattern 342 is formed on the second wire pattern 340.

In other words, in the present embodiment, after the seed pattern 312, 322, 332, and 342 are formed in the light-emitting device 10, without an electroplating or electroless plating process, the first seed pattern 312 is directly regarded as the first pad and is in contact with the first electrode 410 and the second seed pattern 322 is directly regarded as the second pad and is in contact with the second electrode 420. Similarly, the third seed pattern 332 and the fourth pattern 342 are respectively regarded as the first power line and the second power line. As a result, the light-emitting device 10A can achieve similar technical effects as the embodiments above.

Figure 5:
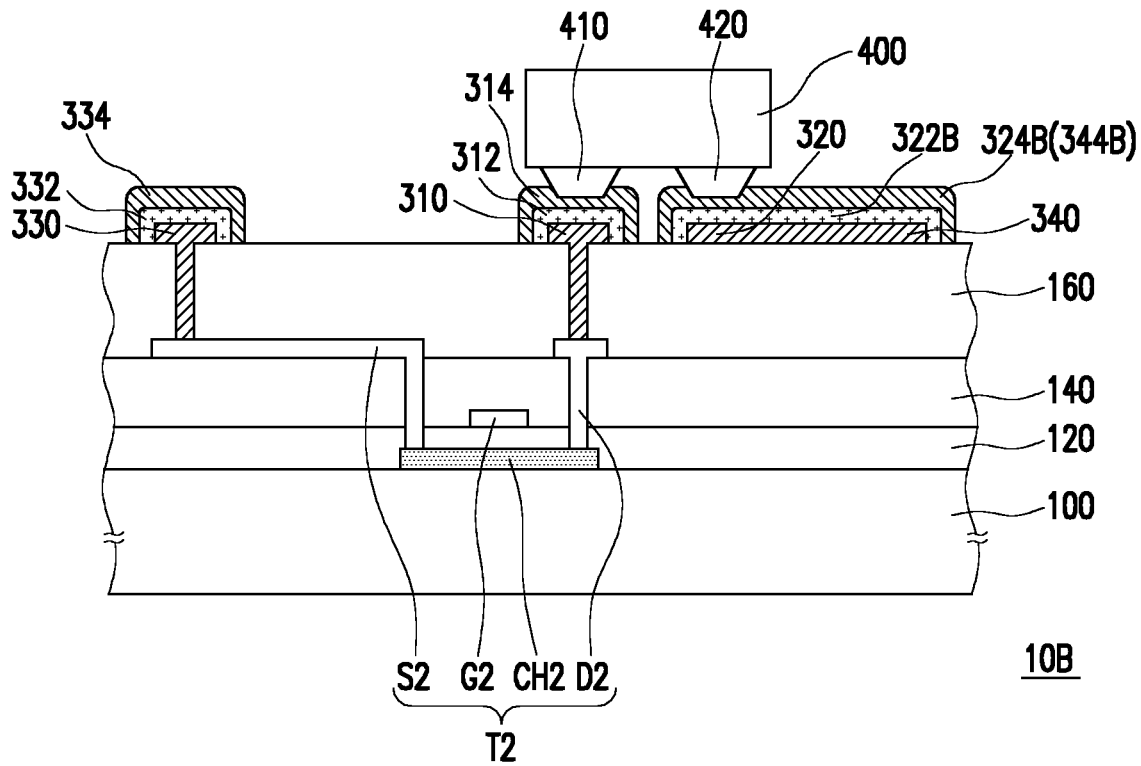
FIG. 5 is a cross section of a light-emitting device of yet another embodiment of the invention.

FIG. 5 is a cross section of a light-emitting device of yet another embodiment of the invention. Referring to FIG. 2 and FIG. 5, a light-emitting device 10B of the present embodiment is similar to the light-emitting device 10 of FIG. 2, and the main difference is that the second conductive pattern 320 is directly connected to the second wire pattern 340 and the connecting pattern 350 is omitted. In the present embodiment, after the conductive patterns 310 and 320 and the wire patterns 330 and 340 are formed, the first seed pattern 312 is formed on the first conductive pattern 310 and the third seed pattern 332 is formed on the first wire pattern 330. A second seed pattern 322B is formed on and covers the second conductive pattern 320 and the second wire pattern 340. Next, the first pad 314 is formed on the first seed pattern 312, the first power line 334 is formed on the third seed pattern 332, and a second pad 324B is formed on the second seed pattern 322B by an electroplating method or an electroless plating method to cover the second conductive pattern 320 and the second wire pattern 340 at the same time. In other words, in the present embodiment, the second pad 324B can be used as a portion of the second power line 344B, and the two are in actuality an integral structure. Moreover, the second pad 324B is used as a portion of the second power line 344B, such that the second conductive pattern 320 and the second wire pattern 340 are directly connected at the same film layer. As a result, the connecting pattern 350 and contact holes O2 and V2 can be omitted to further simplify the process. Moreover, the second pad 324B has a greater cross-sectional area and can be formed using a material having low resistance, and therefore current crowding can be reduced, and IR drop can be reduced. As a result, the light-emitting device 10B can achieve similar technical effects as the embodiments above. In other embodiments, the second conductive pattern 320 is not directly connected to the second wire pattern 340, and the two are electrically connected to each other by the seed pattern 322B covering the second conductive pattern 320 and the second wire pattern 340 at the same time.

Figure 6:
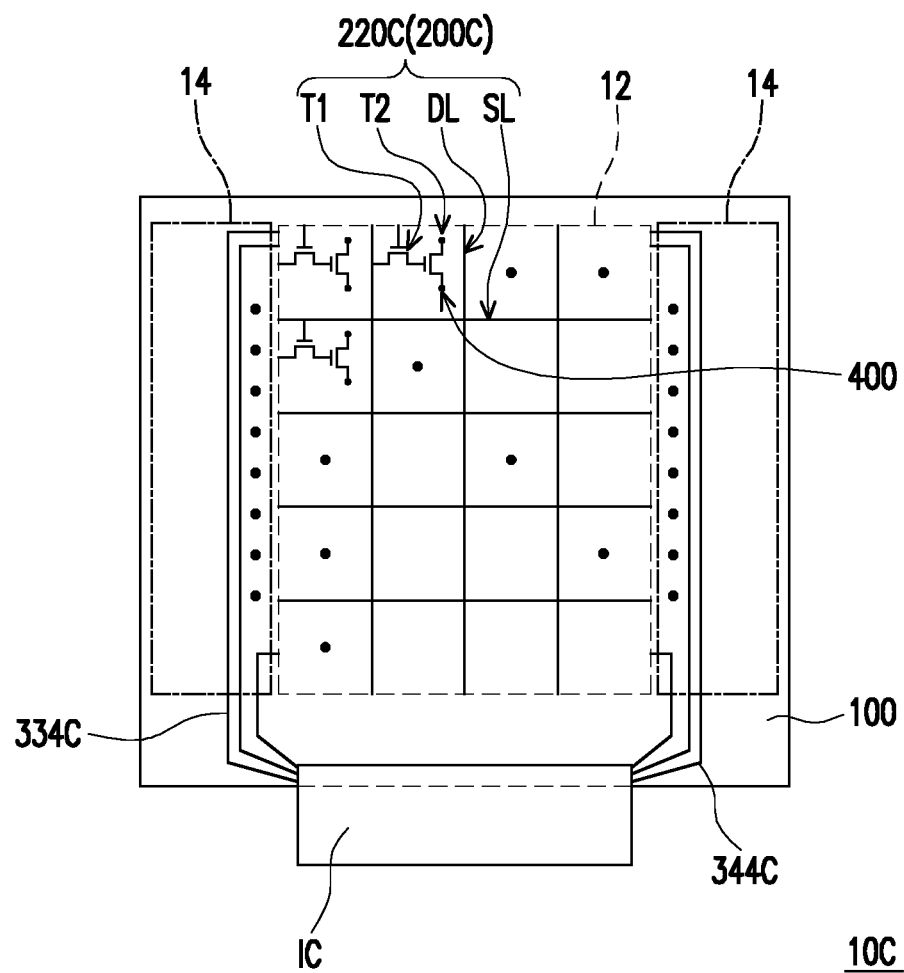
FIG. 6 is a top view of a light-emitting device of another embodiment of the invention.

FIG. 6 is a top view of a light-emitting device of another embodiment of the invention, and for convenience and observation, FIG. 6 only schematically shows the connection relationship of a number of circuit units 220C and a number of scan lines SL and data lines DL. Referring to FIG. 1 and FIG. 6, a light-emitting device 10C of the present embodiment is similar to the light-emitting device 10 of FIG. 1, and the main difference is that the light-emitting device 10C further includes an active region 12 and a peripheral region 14, wherein the plurality of light-emitting elements 400 and the plurality of circuit units 220C of the circuit array 200C are located in the active region 12. Each of the first power lines 334C and each of the second power lines 344C are not located in the active region 12 and are located in the peripheral region 14. In the present embodiment, each of the circuit units 220C can be respectively electrically connected to the first power line 334C and the second power line 344C by a connecting structure, which is formed together by a bridge connection (not shown), a second source (not shown), and a connecting pattern (not shown), and the connecting structure extended from the active region 12 to the peripheral region 14. The first power line 334C and each of the second power lines 344C can be electrically connected to an external circuit IC such as a flexible printed circuit board, a tape carrier package, or a chip-on-film, but the invention is not limited thereto. Under the configuration above, since the pad (not shown) in the active region 12 and the power lines 334C and 344C in the peripheral region 14 can all be made by a material having low resistance and by an electroplating process or electroless plating process, the manufacturing process of the light-emitting device 10C can be simplified and the resistance of the power lines 334C and 344C can be lowered. As a result, the light-emitting device 10C can achieve similar technical effects as the embodiments above.

Based on the above, in the light-emitting device and the manufacturing method thereof of an embodiment of the invention, since the first pad, the second pad, the first power line, and the second power line can be formed at the same time by a material having low resistance, the process can be simplified. Moreover, the resistance of the first power line and the second power line can be lowered to reduce current crowding and reduce IR drop. Moreover, the first power line and the third seed pattern may be regarded as one single unit, and the second power line and the fourth seed pattern may be regarded as one single unit, and therefore the cross-sectional area of the power supply line can be increased to further lower the resistance of the power supply lines. As a result, in comparison to the power line design of the known light-emitting device, the light-emitting device of an embodiment of the invention can reduce energy consumption and reduce voltage drop to increase the brightness and light-emitting quality of the light-emitting elements. In addition, since the power voltage supplied to the light-emitting elements and the most suitable operating voltage of the light-emitting elements are substantially the same, the service life and brightness uniformity of the light-emitting elements can be increased. Accordingly, the overall brightness of the light-emitting device can be increased, and the quality of the light-emitting device can be further increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a light-emitting device, comprising:
   forming a circuit array on a substrate, wherein the circuit array comprises a plurality of circuit units;
   forming a first conductive pattern, a second conductive pattern, a first wire pattern, and a second wire pattern on the circuit array at the same time; and
   disposing a light-emitting element on one of the circuit units, wherein the light-emitting element comprises a first electrode and a second electrode respectively electrically connected to the first conductive pattern and the second conductive pattern.

2. The manufacturing method of the light-emitting device of claim 1, wherein before the step of disposing the light-emitting element, further comprising:
   forming a first seed pattern and a second seed pattern respectively located on the first conductive pattern and the second conductive pattern, wherein a method of forming the first seed pattern and the second seed pattern comprises a sputtering method, a thermal evaporation method, an electron gun vacuum evaporation method, or an atomic layer chemical vapor deposition method, wherein materials of the first conductive pattern and the second conductive pattern comprise indium tin oxide, molybdenum, aluminum, titanium, titanium oxide, copper or a copper alloy, or silver or a silver alloy; and
   applying a voltage to the first conductive pattern and the second conductive pattern to form a first pad and a second pad respectively located on the first seed pattern and the second seed pattern by an electroplating method, wherein after the step of disposing the light-emitting element, the first pad and the second pad are respectively electrically connected to the first electrode and the second electrode.

3. The manufacturing method of the light-emitting device of claim 2, further comprising:
   forming a third seed pattern and a fourth seed pattern respectively located on the first conductive pattern and the second conductive pattern; and
   forming a first power line and a second power line respectively located on the third seed pattern and the fourth seed pattern, wherein the first power line, the second power line, the first pad, and the second pad are formed at the same time.

4. The manufacturing method of the light-emitting device of claim 3, wherein materials of the first power line, the second power line, the first pad, and the second pad comprise copper, silver, gold, aluminum, tin, or nickel, wherein each of the circuit units comprises:
   a scan line and a data line;
   a first thin-film transistor electrically connected to the scan line and the data line, wherein the first thin-film transistor comprises a first gate, a first channel layer, a first source, and a first drain;
   a second thin-film transistor comprising a second gate, a second channel layer, a second source, and a second drain, wherein the first drain is electrically connected to the second gate, the second source is electrically connected to the first power line, the second drain is electrically connected to the first conductive pattern, and the second electrode is not overlapped with the first wire pattern and the second wire pattern; and
   a connecting pattern electrically connected between the second conductive pattern and the second wire pattern.

5. The manufacturing method of the light-emitting device of claim 1, wherein before the step of disposing the light-emitting element, further comprising:
   forming a first seed pattern and a second seed pattern respectively located on the first conductive pattern and the second conductive pattern, wherein a method of forming the first seed pattern and the second seed pattern comprises a sputtering method, a thermal evaporation method, an electron gun vacuum evaporation method, or an atomic layer chemical vapor deposition method; and
   forming a first pad and a second pad respectively located on the first seed pattern and the second seed pattern by an electroless plating method, wherein after the step of disposing the light-emitting element, the first pad and the second pad are respectively electrically connected to the first electrode and the second electrode.

6. The manufacturing method of the light-emitting device of claim 5, further comprising:
   forming a third seed pattern and a fourth seed pattern respectively located on the first conductive pattern and the second conductive pattern; and
   forming a first power line and a second power line respectively located on the third seed pattern and the fourth seed pattern, wherein the first power line, the second power line, the first pad, and the second pad are formed at the same time.

7. The manufacturing method of the light-emitting device of claim 6, wherein materials of the first power line, the second power line, the first pad, and the second pad comprise copper, silver, gold, aluminum, tin, or nickel, wherein each of the circuit units comprises:
   a scan line and a data line;
   a first thin-film transistor electrically connected to the scan line and the data line, wherein the first thin-film transistor comprises a first gate, a first channel layer, a first source, and a first drain respectively electrically connected to the first channel layer;
   a second thin-film transistor comprising a second gate, a second channel layer, a second source, and a second drain respectively electrically connected to the second channel layer, wherein the first drain is electrically connected to the second gate, the second source is electrically connected to the first power line, the second drain is electrically connected to the first conductive pattern, and the second electrode is not overlapped with the first wire pattern and the second wire pattern; and
   a connecting pattern electrically connected between the second conductive pattern and the second wire pattern.

8. A light-emitting device, comprising:
   a substrate;
   a circuit array disposed on the substrate, wherein the circuit array comprises a plurality of circuit units;
   a first conductive pattern, a second conductive pattern, a first wire pattern, and a second wire pattern disposed on the circuit array; and
   a light-emitting element disposed on one of the circuit units, the light-emitting element comprising a first electrode and a second electrode respectively electrically connected to the first conductive pattern and the second conductive pattern, and the second electrode is not overlapped with the first wire pattern and the second wire pattern.

9. The light-emitting device of claim 8, further comprising:
   a first seed pattern and a second seed pattern respectively located on the first conductive pattern and the second conductive pattern, wherein materials of the first conductive pattern and the second conductive pattern comprise indium tin oxide, molybdenum, aluminum, titanium, titanium oxide, copper or a copper alloy, or silver or a silver alloy;
   a first pad and a second pad respectively located on the first seed pattern and the second seed pattern, wherein the first pad and the second pad are respectively electrically connected to the first electrode and the second electrode;
   a third seed pattern and a fourth seed pattern respectively located on the first wire pattern and the second wire pattern; and
   a first power line and a second power line respectively located on the third seed pattern and the fourth seed pattern, wherein the first power line, the second power line, the first pad, and the second pad are of the same patterned film layer, wherein materials of the first power line, the second power line, the first pad, and the second pad comprise copper, silver, gold, aluminum, tin, or nickel.

10. The light-emitting device of claim 9, wherein each of the circuit units comprises:
   a scan line and a data line;
   a first thin-film transistor electrically connected to the scan line and the data line, wherein the first thin-film transistor comprises a first gate, a first channel layer, a first source, and a first drain;
   a second thin-film transistor comprising a second gate, a second channel layer, a second source, and a second drain, wherein the second source is electrically connected to the first power line, the second drain is electrically connected to the first conductive pattern, and the second electrode is not overlapped with the first wire pattern and the second wire pattern; and
   a connecting pattern electrically connected between the second conductive pattern and the second wire pattern.

11. The light-emitting device of claim 9, wherein each of the circuit units comprises:
   a scan line and a data line;
   a first thin-film transistor electrically connected to the scan line and the data line, wherein the first thin-film transistor comprises a first gate, a first channel layer, a first source, and a first drain; and
   a second thin-film transistor comprising a second gate, a second channel layer, a second source, and a second drain, wherein the second source is electrically connected to the first power line, the second drain is electrically connected to the first conductive pattern, the second electrode is not overlapped with the first wire pattern and the second wire pattern, and the second conductive pattern is directly connected to the second wire pattern.

12. The light-emitting device of claim 9, wherein the light-emitting element and the circuit units are located in an active region, each of the first power lines and each of the second power lines are not located in the active region and are located in a peripheral region, and each of the circuit units comprises:
   a scan line and a data line;
   a first thin-film transistor electrically connected to the scan line and the data line, wherein the first thin-film transistor comprises a first gate, a first channel layer, a first source, and a first drain respectively electrically connected to the first channel layer; and
   a second thin-film transistor comprising a second gate, a second channel layer, a second source, and a second drain respectively electrically connected to the second channel layer, wherein the first drain is electrically connected to the second gate, the second source is electrically connected to the first power line, the second drain is electrically connected to the first conductive pattern, and the second electrode is not overlapped with the first wire pattern and the second wire pattern.

* * * * *